United States Patent
Chang et al.

(10) Patent No.: US 7,728,664 B2
(45) Date of Patent: Jun. 1, 2010

(54) LOW NOISE AMPLIFIER WITH MULTIPLE INPUTS AND MULTIPLE OUTPUTS

(75) Inventors: Sung-Hsien Chang, Irvine, CA (US); Juo-Jung Hung, Irvine, CA (US); Stephen Edward Krafft, Los Angeles, CA (US); Ertan Zencir, Irvine, CA (US); Stefano Bozzola, Genoa (IT); Ramon Alejandro Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/984,512

(22) Filed: Nov. 19, 2007

(65) Prior Publication Data

US 2008/0116976 A1    May 22, 2008

Related U.S. Application Data

(60) Provisional application No. 60/860,225, filed on Nov. 21, 2006.

(51) Int. Cl.
*H03G 3/20* (2006.01)

(52) U.S. Cl. .................................. 330/140; 330/147

(58) Field of Classification Search ............... 330/140, 330/147, 148
See application file for complete search history.

(56) References Cited

U.S. PATENT DOCUMENTS

| 4,263,561 | A | * | 4/1981 | Weber | 330/149 |
| 4,683,441 | A | * | 7/1987 | Naylor | 330/69 |
| 5,724,349 | A | * | 3/1998 | Cloonan et al. | 370/390 |
| 7,408,406 | B2 | * | 8/2008 | Hickman et al. | 330/69 |

* cited by examiner

*Primary Examiner*—Henry K Choe
(74) *Attorney, Agent, or Firm*—Sterne, Kessler, Goldstein & Fox P.L.L.C.

(57) ABSTRACT

Satellite set-top boxes (STB) are increasingly being designed with multiple tuners, making them capable of receiving more than one program at a time. In addition, satellite STBs are increasingly being designed with multiple inputs, to permit reception of additional channels that will not fit within the conventional satellite intermediate frequency (IF) band (950-2150 MHz). Often, the STB must route these multiple inputs to the multiple tuners with some form of switching function, to allow each tuner to receive all channel bands. Accordingly, the invention includes an RFIC with two RF inputs and three RF outputs, and a crossbar switch that can route any input to any output. The two inputs are amplified by low-noise amplifier stages.

26 Claims, 6 Drawing Sheets

200

300

LOW NOISE AMPLIFIER WITH MULTIPLE INPUTS AND MULTIPLE OUTPUTS

CROSS REFERENCE TO RELATED APPLICATIONS

This application claims the benefit of U.S. Provisional Application No. 60/860,225 filed Nov. 21, 2006, which is incorporated herein by reference in its entirety.

BACKGROUND OF THE INVENTION

1. Field of the Invention

The present invention generally relates to a low noise amplifier with multiple inputs and multiple outputs.

2. Background Art

Satellite set-top boxes (STB) are increasingly being designed with multiple tuners, making them capable of receiving more than one program at a time. In addition, satellite STBs are increasingly being designed with multiple inputs, to permit reception of additional channels that will not fit within the conventional satellite intermediate frequency (IF) band (950-2150 MHz). Often, the STB must route these multiple inputs to the multiple tuners with some form of switching function, to allow each tuner to receive all channel bands.

At present, satellite STBs use complex front ends designed with discrete transistors, diodes and filters to perform these functions. These discrete front ends have limited performance and require large amounts of area on the STB printed circuit boards (PCBs). This is because complex circuits that would improve the performance, such as automatic gain control (AGC) and differential amplifiers are prohibitively large and expensive when implemented with standard discrete components.

In addition, discrete RF design is a difficult and time-consuming process. Given the short life cycles of consumer electronic products, a lengthy and error-prone design process may be unacceptable.

What is necessary is a radio-frequency integrated circuit (RFIC) that incorporates splitting, switching, AGC, and filtering functions for multi-input/multi-tuner satellite STBs.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

DETAILED DESCRIPTION OF THE INVENTION

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described. An embodiment of the present invention is now described. While specific methods and configurations are discussed, it should be understood that this is done for illustration purposes only. A person skilled in the art will recognize that other configurations and procedures may be used without departing from the spirit and scope of the invention.

Overview

One or more embodiments of the present invention provide an amplifying circuit that includes a first amplifying stage, a second amplifying stage, and a crossbar switch. The first amplifying stage has multiple inputs. The second amplifying stage has multiple outputs. The crossbar switch is configured to direct information or electrical signals from any of the multiple inputs to any of the multiple outputs. The first amplifying stage comprises a first variable gain amplifier (VGA) having an output coupled to the crossbar switch and a second variable gain amplifier having an output coupled to the crossbar switch. Each of the VGAs serves as an input to the amplifying circuit.

The amplifying circuit also includes a buffer amplifier coupled in parallel to the first VGA. In this way, the amplifying circuit may receive a pre-amplified signal from an external source, i.e., another amplifying circuit, and bypass first VGA via the buffer amplifier. This configuration helps avoid signals to be over amplified which cause the amplifier circuit to saturate.

Electrical signals could also be transferred from one of the multiple inputs to one of the multiple outputs. This is accomplished using a daisy chain which directs electrical signals from one of the inputs to one of the outputs via a second buffer amplifier. The output of the second buffer amplifier is coupled to the crossbar, which can switch information or electrical signals to any of the multiple outputs of the amplifying circuit.

The amplifying circuit also includes power detectors configured to adjust the output power level of the first and second VGAs based on their respective previous output. In this way, the amplifying circuit may achieve a desired level of signal amplification.

Exemplary Amplifying Circuit Embodiment(s)

Figure 1:
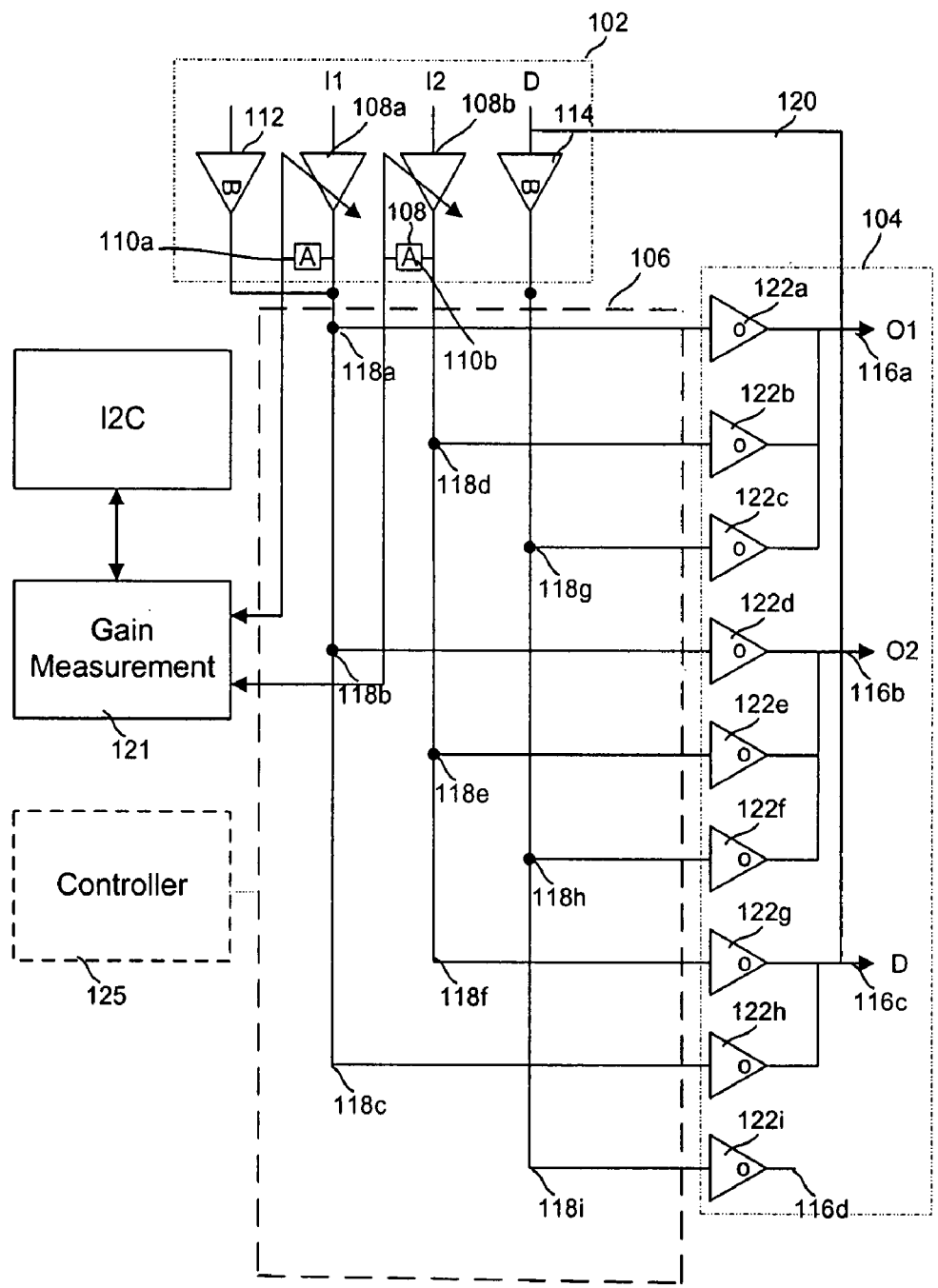
FIG. 1 is a block diagram of a multi-input multi-output LNA according to embodiments of the present invention.

FIG. 1 shows a block diagram of a radio frequency integrated circuit (RFIC) 100 according to an embodiment of this invention. RFIC 100 includes a first amplifying stage or input amplifying stage 102, a second amplifying stage or output amplifying stage 104, a crossbar switch 106, and an optional controller 125. Stage 102 has two inputs. Each input is an input to a variable gain amplifier (VGA) or a low noise amplifier (LNA) 108a-b, which amplifies received data signals and outputs amplified signals to crossbar switch 106. In an example, the RFIC 100 processes a signal in a range between 250 MHz and 2150 MHz. Processing by the RFIC 100 is not limited to this frequency range.

Crossbar switch 106 can route any input to any output. RFIC 100 also includes a daisy chain bypass 120 that couples together any input to any output. The invention is not limited to the number of inputs and outputs shown, as any number inputs could be routed to any number of outputs. In an embodiment, controller 125 is configured to instruct crossbar switch 106 to route signal from anyone of the inputs to anyone of the outputs. In this way, RFIC 100 may be programmed to route data signal in various ways.

In the embodiment where VGAs are used, each of the VGAs (108a or 108b) is controlled by an automatic gain control (AGC) loop. In this embodiment, the AGC loop adjusts the input amplifier gain to maintain the total power of all of the output signals constant. The AGC loop includes power detectors 110a-b to detect the respective output power of input amplifiers 108a-b and control the gain of amplifiers 108a-b. If the AGC set point is chosen appropriately, this approach will optimally balance noise and distortion arising from each of the input amplifiers. This is in contrast to an AGC loop which operates to maintain only the desired signal power at some set level. Such a loop will set the gain very high when the desired signal is weak; possibly producing to much distortion if the unwanted signals are strong. Vice-versa, when the desired signal is strong but most other signals are weak, it will set the gain too low, possibly compromising signal-to-noise ratio (SNR). If no AGC loop is used, the dynamic range of the RF components in the STB must be higher, usually leading to higher costs and power dissipation.

A feature of this embodiment is a circuit 121 which measures the gain control voltage of the AGC loop. This value is then used in combination with other information to obtain a RSSI (received signal strength indication) function.

RFIC 100 also includes two buffer amplifiers 112 and 114. Buffer amplifier 112 is coupled in parallel to VGA 108a. Buffer amplifiers 112 and 114 are used to drive controlled-impedance outputs at the desired power level. Other embodiments might have more inputs and/or outputs, or have less than full crossbar switches. As shown in FIG. 1, the LNA is a two stage amplifier with crossbar switch 106 between the input amplifier stage 102 and the output amplifier stage 104. Any input can be coupled to any output via crossbar switch 106. For example, output signals from VGA 108a can be switched to output node 116a, 116b, or 116c via node 118a, 118b, or 118c, respectively. Similarly, output signals from VGA 108b can be switched to output node 116a, node 116b, or node 116c via node 118d, 118e, or 118f, respectively. Output amplifiers 122a-c are coupled to common output node 116a. Output amplifiers 112d-f are coupled to common output node 116b. Similarly, output amplifiers 122g-h are coupled to common output node 116c.

As shown in FIG. 1, output node 116c is coupled to daisy chain 120 which provides input signals to buffer amplifier 114. Alternatively, daisy chain 120 receives a signal at the input of buffer amplifier 114 and outputs the received signal at node 116c. As mentioned, daisy chain 120 is a bi-directional medium, meaning signal may be transferred to or from node 116c and an input node of buffer amplifier 114. Signals from output node 116c may be already amplified by VGA 108a or 108b, accordingly these pre-amplified signals are forwarded to output node 116a or 116b via buffer amplifier 114 to avoid over amplification which may cause output amplifier 122c, 122f, or 122i to saturate. In this embodiment, buffer amplifiers 112 and 114 are unity gain buffer amplifier.

Although not shown, RFIC 100 may include a switching controller coupled to crossbar switch 106. Switching controller may receive switching inputs from an external source. Switching controller main responsibility is to provide instructions to crossbar switch 106 on where to direct an input RF signal. For example, switching controller may inform crossbar switch 106 to gate input RF signals from VGA 108a to output node 116b or 116c.

An important requirement for multi-input STBs is that the multiple inputs do not interfere with each other. This means that there must be a high isolation between the different inputs and outputs. High isolation and low noise can be achieved with a combination of circuit and package design techniques.

One technique is the use of differential RF input signals. Differential signals have several advantages over single-ended input signal such as higher operating frequency, higher signal to noise ratios, and less sensitivity to noises. Unlike single-ended signals which need a reference signal, differential signals are referenced to each other, thus allowing a differential circuit to operate at a higher frequency by eliminating the need of timing the single-ended signal with respect to the reference signal. Differential signals are less susceptible to noises because any external noises that enter the system will be found on both differential signals, thus creating common mode signals. In a differential signals system, common mode signals cancel each other out and have little effect on the original signal.

Figure 2:
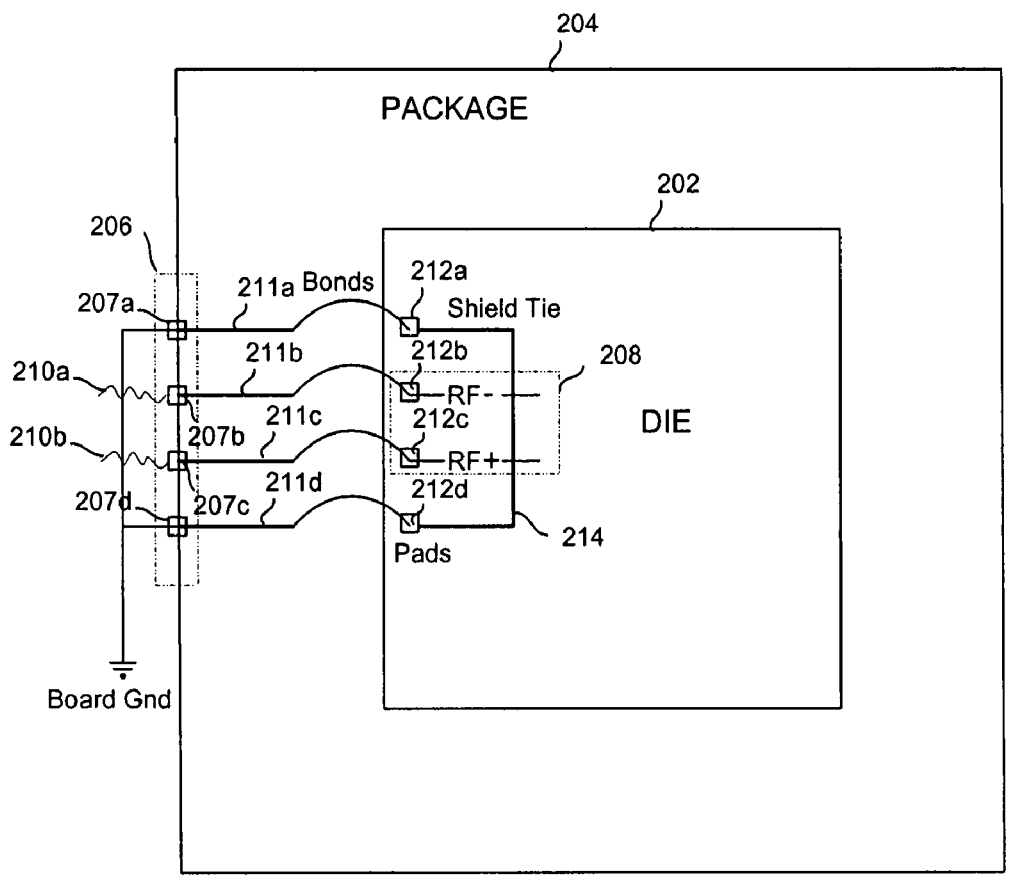
FIG. 2 illustrates a RF shielding package according to embodiments of the present invention.

FIG. 2 illustrates an IC package 200 according to an embodiment of the present invention. IC package 200 includes an integrated circuit or die 202 and a circuit board 204. Differential signals 210a and 210b are fed into the circuit board 204 at input terminals 206. Die 202 receives differential signals 210a and 210b at input terminals 208. Input terminals 206 includes ground pads 207a and 207d, an inverting input pad 207b, and a non-inverting input pad 207c. Input pads 207b-c are placed between and close to ground pads 207a and 207d. In this way, stray electrical noises are induced to couple onto ground pads 207a and 207d instead of input pads 207b-c, thus shielding input pads 207b-c from external noises. Similarly, transmission lines 211b-c are also shielded by transmission lines 211a and 211d.

As shown in FIG. 2, input terminals 208 includes shield pads 212a and 212d, an inverting input pad 212b, and a non-inverting input pad 212c. Shield pads 212a and 212d are tied together by a common transmission line 214 and are grounded via ground pads 207a and 207d. In this way, input pads 212b-c are effectively shielded from noises that are common to both shield pads 212a and 212d. Further, transmission line 214 is placed such that it surrounds input pads 212b-c. This helps attract external noises such as stray electrical couplings away from input pads 212b-c.

Another technique is to place the inputs and outputs that must be isolated from each other on different sides of the IC package. This reduces unwanted coupling both by increasing the distance between signal lines and (when the signals are on adjacent sides) because of the lower mutual inductance for lines that are oriented at 90 degrees to each other, compared to parallel lines.

Isolation must also be considered in the design of crossbar switch 106. In a switch, off isolation is a measure of how well the switch isolate the output from any input signal during "off" or break mode. Generally, the off isolation of a switch is frequency dependent. At very high frequency, isolation degrades as more signals from the input couple into the output. Thus it is essential to use high-isolation switch in designing crossbar switch 106. Thus, whenever appropriate, hi-isolation T-Switch is used at every switching junction.

Figure 3:
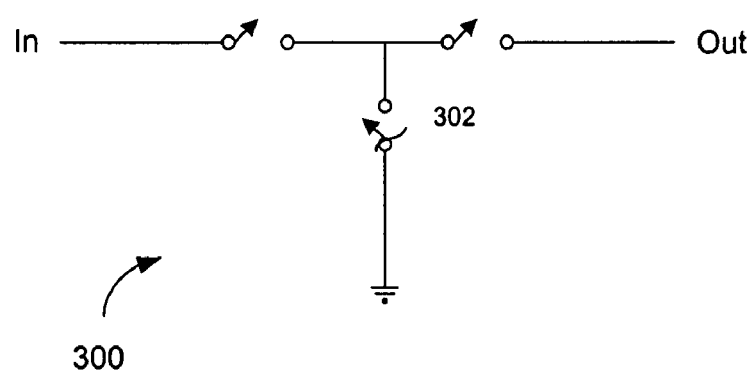
FIG. 3 illustrates a high isolation T-switch for use in the crossbar switch 104.

FIG. 3 illustrates an exemplary T-Switch 300 used in crossbar switch 106. T-Switch 300 is generally constructed of three n-channel MOSFETs (metal-oxide semiconductor field-effect transistor). T-Switch 300 provides high isolation by coupling a transistor 302 to ground. When T-Switch 300 is in off mode, transistor 302 is on. In this way, signals that bleed through the input are shunted to ground. It should be noted that other type of isolation switches could also be used in designing and fabricating crossbar switch 106.

Figure 5:
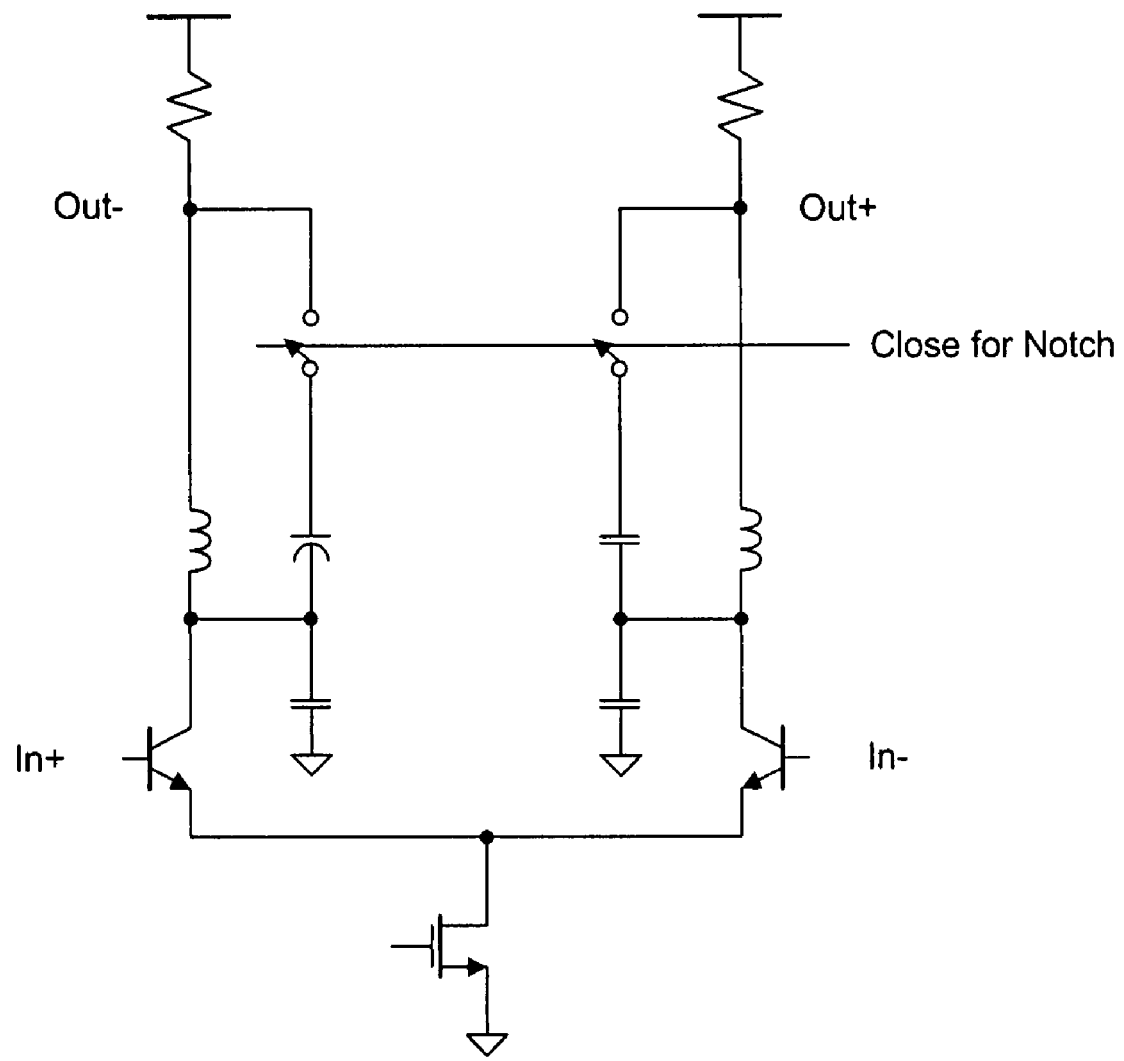
FIG. 5 illustrates a switchable notch filter according to embodiments of the invention.

To further reduce noises and interferences, RFIC 100 utilizes frequency filters to filter out any harmonics of the input RF signals. In general, RF tuners are susceptible to interference from RF signals at multiples (e.g. twice) of the desired frequency. This is due to the harmonic response of the tuner mixer. Specifically, an interfering RF signals can be received at 2× the desired RF input signal when using direct conversion. The interfering RF signal can mix with the 2nd harmonic of the local oscillator, so as to be down-converted directly to baseband, thereby interfering with the preferred down-converted baseband signal. To reduce this susceptibility, switched filters may be inserted in the output signal path. The switched filters operate to remove the interfering RF signal that occurs at 2× the local oscillator frequency, which is also 2× p the desired RF frequency for direct conversion. An embodiment of such a switched filter is shown in FIG. 5. This is a switched LC notch filter, with the notch centered at about 2 GHz. This reduces the level of unwanted double-frequency signal reaching the tuner when the desired RF signal is near 1 GHz. The switched filer may also reduce a total power input to the tuner.

Filters might also be included for other purposes, such as to reduce low-frequency signals that produce unwanted second-order distortion.

FIG. 4A-4D illustrates some of the possible applications of this IC in a STB. As shown, by having three outputs, it is possible to cascade two or more ICs and drive more than three tuners. This also permits more than two inputs per STB.

Figure 4A:
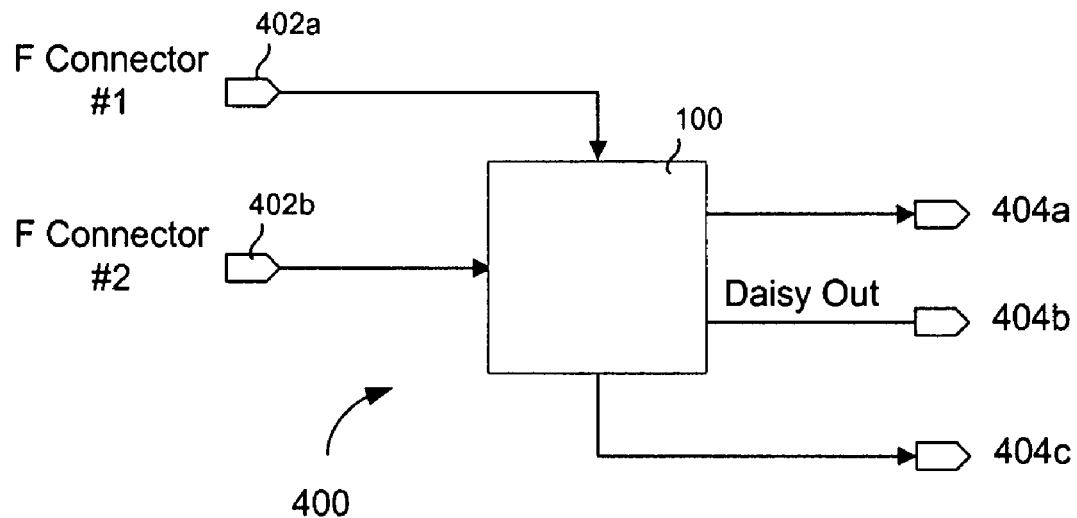
FIGS. 4A-4D illustrate various input/output configurations for the LNA.
Figure 4B:
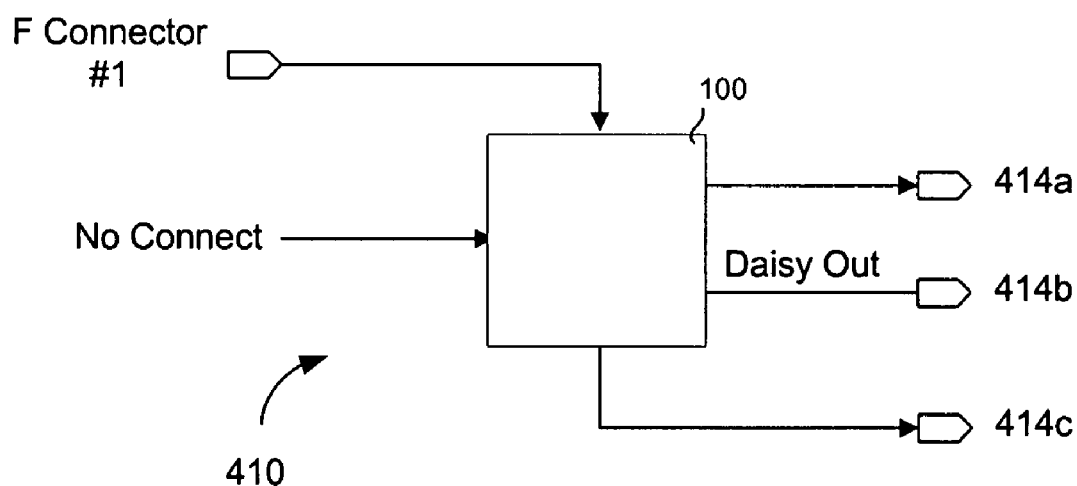
Figure 4C:
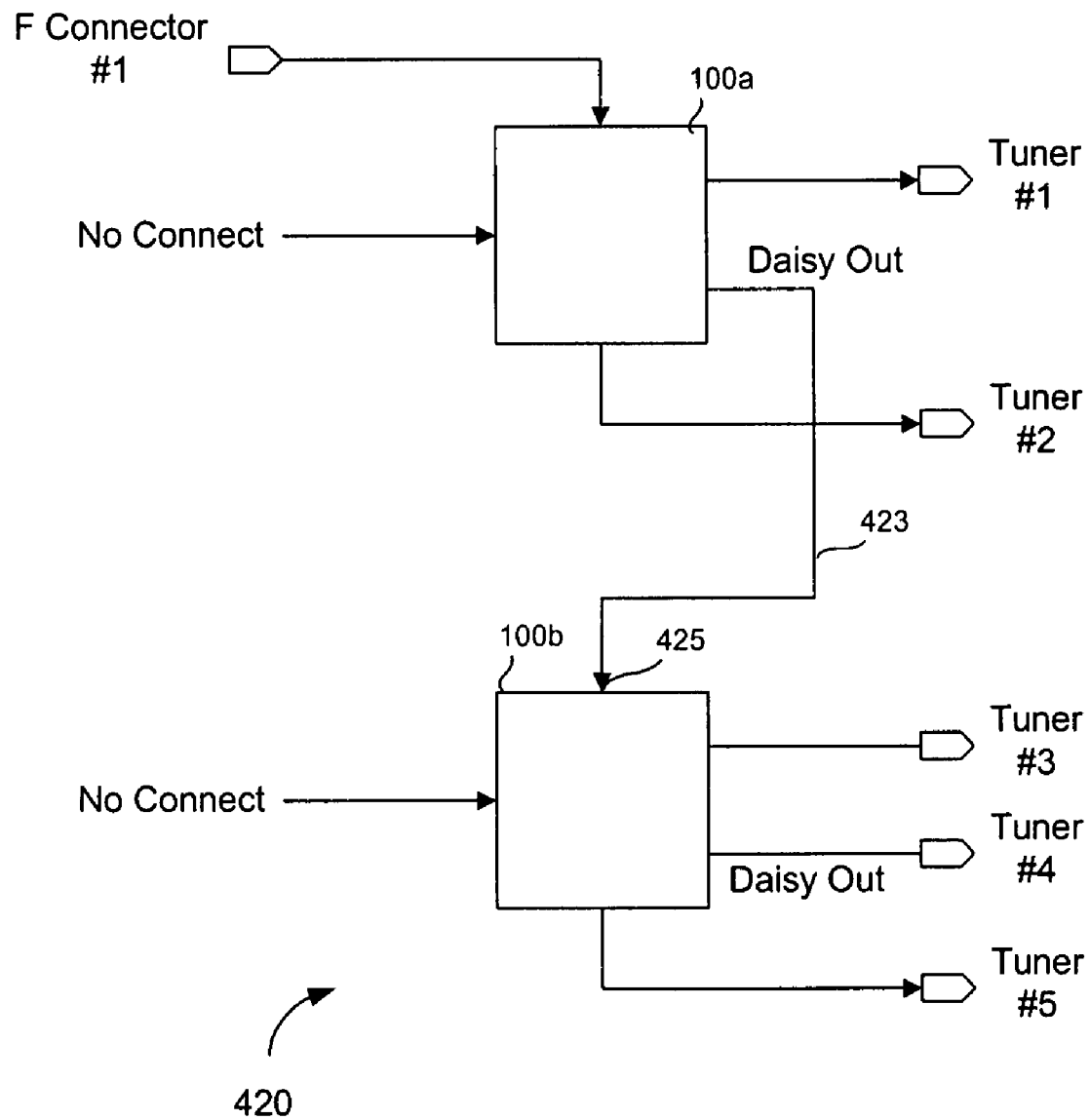

FIGS. 4A-B illustrate exemplary implementations of RFIC 100 in integrated circuits 400 and 410 for use in a STB. As shown in FIG. 4A, IC 400 has two inputs 402a-b and three outputs 404a-c. Output 404b is a daisy output, which may be routed to a tuner or to another RFIC. An example of such implementation is shown in FIG. 4C. Similar to IC 400, IC 410 has three outputs 414a-c, but with only a single input, as shown in FIG. 4B.

FIG. 4C illustrates an exemplary implementation of RFIC 100 in a cascade configuration 420 that has two ICs interconnected by the daisy output of one of the ICs. Configuration 420 includes two ICs 100a-b. Each IC is similar to IC 100. As shown, daisy output 423 of IC 100a is coupled to an input 425 of IC 100b.

In an embodiment, input 425 is coupled to a RFIC similar to RFIC 100 that is part of IC 100b. More specifically, input 425 is coupled to a buffer amplifier similar to buffer amplifier 114. In this way, RF signals from daisy output 423 will not be over-amplified which may lead to saturation. Alternatively, input 425 may be coupled to buffer amplifier 112. As shown, configuration 420 yields 5 outputs for one input.

Figure 4D:
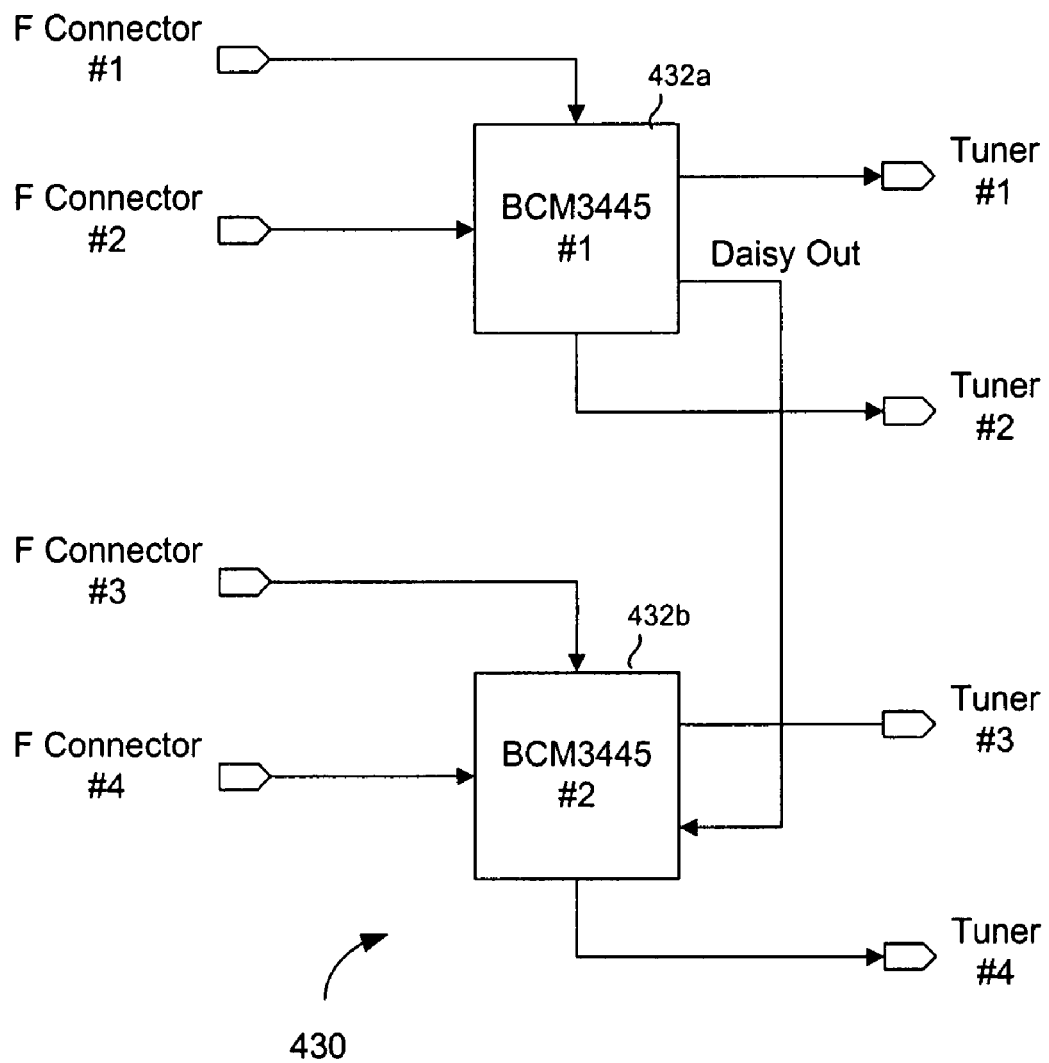

FIG. 4D illustrates a cascade configuration 430 similar to configuration 420 according to an embodiment of the present invention, but with multiple inputs. Configuration 430 includes two ICs 432a-b. Each of the ICs 432a-b is similar to IC 400. As shown, configuration 430 has four inputs and four outputs.

It should be understood that the configurations above are not limited to the number of inputs and outputs shown, as any number inputs could be routed to any number of outputs, and that more than two ICs could be used in a configuration.

This invention describes a satellite STB front end that can drive multiple tuners from multiple sources. It incorporates a crossbar switch, so that any tuner can be driven from any input. It may incorporate a daisy-chain output, to permit cascading multiple ICs. This allows the STB to include more inputs and/or more tuners. It may incorporate AGC loops, which reduce the dynamic range requirements of the STB RF circuits and therefore their cost and complexity. It may incorporate switched filters to reduce the susceptibility of the STB to unwanted signals.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An amplifying circuit, comprising:
   a first amplifying stage having multiple inputs;
   a second amplifying stage having multiple outputs; and
   a crossbar switch configured to map any of the multiple inputs to any of the multiple outputs,
   wherein the first amplifying stage comprises:
      a first variable gain amplifier (VGA) having an output coupled to the crossbar switch; and
      a second variable gain amplifier having an output coupled to the crossbar switch.

2. The amplifying circuit of claim 1, further comprising a daisy chain that directly connects one of the multiple inputs to one of the multiple outputs.

3. An amplifying circuit, comprising:
   a crossbar switch configured to map any of multiple inputs to any of multiple outputs;
   a first amplifying stage having a first variable gain amplifier (VGA) coupled to a first of the multiple inputs and a second VGA coupled to a second of the multiple inputs;
   a second amplifying stage coupled to the multiple outputs; and
   a first power detector configured to adjust an output power level of the first VGA based on a previous output power level of the first VGA.

4. The amplifying circuit of claim 3, wherein the first amplifying stage further comprises:
   a second power detector configured to adjust an output power level of the second VGA based on a previous output power level of the second VGA.

5. The amplifying circuit of claim 1, wherein an output of the second amplifying stage comprises:
   a first, second, and third amplifiers having inputs coupled to outputs of the crossbar switch and outputs coupled to the output of the second amplifying stage.

6. An amplifying circuit, comprising:
   a crossbar switch configured to map any of multiple inputs to any of multiple outputs;
   a first amplifying stage having a first variable gain amplifier (VGA) coupled to a first of the multiple inputs and a second VGA coupled to a second of the multiple inputs;
   a second amplifying stage having a first, second, and third amplifiers coupled to the multiple outputs;
   a first buffer amplifier coupled in parallel to the first amplifying stage; and a second buffer amplifier having an input coupled to an output of the second amplifying stage and an output coupled to the crossbar switch.

7. The amplifying circuit of claim 6, wherein:
an input of the first amplifier is coupled to the output of the first VGA;
an input of the second amplifier is coupled to the output of the second VGA; and
an input of the third amplifier is coupled to the output of the second buffer amplifier.

8. The amplifying circuit of claim 2, wherein a second output of the second amplifying stage comprises:
a first and second amplifiers having inputs coupled to the crossbar and outputs coupled to the daisy chain.

9. The amplifying circuit of claim 6, wherein each buffer amplifier is a unity gain buffer amplifier.

10. An integrated circuit, comprising:
a switch;
a first input amplifier having an output coupled a first node of the switch;
a second input amplifier having an output coupled to a second node of the switch;
a first buffer input amplifier having an output coupled to the first node of the switch;
a second buffer input amplifier having an output coupled to a third node of the switch;
a first, a second, and a third set of output amplifiers, wherein each set has a respective output amplifier having an input coupled each respective node of the switch; and
a controller configured to direct signals from any one of the input amplifiers to any one of the output amplifiers.

11. The integrated circuit of claim 10, wherein each buffer amplifier is a unity gain buffer amplifier.

12. The integrated circuit of claim 10, further comprising:
a first power detector configured to adjust an output power level of the first input amplifier based on a previous output power level of the first input amplifier; and
a second power detector configured to adjust an output power level of the second input amplifier based on a previous output power level of the second input amplifier.

13. The integrated circuit of claim 10, wherein the third set of output amplifiers comprises:
a first and a second output amplifier having outputs coupled to an input of the second buffer input amplifier.

14. The amplifying circuit of claim 1, further comprising:
a controller configured to control the crossbar switch.

15. The amplifying circuit of claim 1, wherein the second amplifying stage comprises a first plurality of amplifiers coupled at a first common output node and a second plurality of amplifiers coupled at a second common output node.

16. The amplifying circuit of claim 1, wherein the crossbar switch is a high isolation T-switch.

17. The amplifying circuit of claim 1, further comprising:
an automatic gain control loop configured to control a gain of the first VGA and to control a gain of the second VGA.

18. The amplifying circuit of claim 17, wherein the automatic gain control loop is configured to adjust at least one of the gain of the first VGA and the gain of the second VGA to maintain a constant total power at the multiple outputs.

19. The amplifying circuit of claim 17, wherein the automatic gain control loop includes a first power detector configured to detect an output power of the first VGA and a second power detector configured to detect an output power of the second VGA.

20. The amplifying circuit of claim 17, wherein the automatic gain control loop has a set point that balances noise and distortion from each of the first VGA and the second VGA.

21. The amplifying circuit of claim 17, further comprising:
a gain control voltage measuring circuit configured to produce a measure a gain control voltage of the automatic gain control loop.

22. The amplifying circuit of claim 21, wherein the measure of the gain control voltage is combined with other information to produce a received signal strength indication function.

23. An amplifying circuit, comprising:
a first amplifying stage having multiple outputs;
a second amplifying stage having multiple inputs; and
a crossbar switch configured to map each of the multiple outputs that are connected to the crossbar switch to any of the multiple inputs of the second amplifying stage.

24. An amplifying circuit, comprising:
a crossbar switch configured to map each of multiple inputs to any of multiple outputs;
a first amplifying stage having a variable gain amplifier coupled to a first of the multiple inputs;
a second amplifying stage having a first, second, and third amplifiers coupled to the multiple outputs; and
a buffer amplifier coupled in parallel to the first amplifying stage.

25. An amplifying circuit, comprising:
a first amplifying stage having multiple inputs;
a second amplifying stage having multiple outputs;
a crossbar switch configured to map any of the multiple inputs to any of the multiple outputs; and
a daisy chain, disposed outside of the crossbar switch, that directly connects one of the multiple inputs to one of the multiple outputs, and is configured to transfer a signal between one of the multiple inputs and one of the multiple outputs.

26. The amplifying circuit of claim 25, wherein the amplifying circuit is disposed in a first integrated circuit and the daisy chain is configured to couple the first integrated circuit to a second integrated circuit.

* * * * *